(12) United States Patent
Jones et al.

(10) Patent No.: US 8,516,897 B1
(45) Date of Patent: Aug. 27, 2013

(54) PRESSURE SENSOR

(75) Inventors: Ryan Jones, Dublin, OH (US); Paul Rozgo, Dublin, OH (US); Richard Charles Sorenson, Columbus, OH (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/401,727

(22) Filed: Feb. 21, 2012

(51) Int. Cl.
*G01L 7/00* (2006.01)
*H01L 27/14* (2006.01)
*H01L 21/02* (2006.01)

(52) U.S. Cl.
USPC .................. 73/754; 73/756; 438/51; 257/414; 257/417

(58) Field of Classification Search
USPC ...................................... 73/700–756
See application file for complete search history.

(56) References Cited

U.S. PATENT DOCUMENTS

| | | | |
|---|---|---|---|
| 3,455,165 A | 7/1969 | Pierre Huet et al. | |
| 4,129,042 A | 12/1978 | Rosvold | |
| 4,168,630 A | 9/1979 | Shirouzu et al. | |
| 4,303,903 A | 12/1981 | Matsuoka et al. | |
| 4,314,225 A | 2/1982 | Tominaga et al. | |
| 4,406,993 A | 9/1983 | Kurtz | |
| 4,656,454 A | 4/1987 | Rosenberger | |
| 4,763,098 A | 8/1988 | Glenn et al. | |
| 4,939,497 A | 7/1990 | Nishida et al. | |
| 5,012,677 A | 5/1991 | Shimada et al. | |
| 5,025,667 A | 6/1991 | Strasser | |
| 5,257,457 A | 11/1993 | Cotter | |
| 5,465,626 A | 11/1995 | Brown et al. | |
| 5,625,151 A | 4/1997 | Yamaguchi | |
| 5,695,590 A * | 12/1997 | Willcox et al. | ............ 156/272.2 |
| 5,811,690 A | 9/1998 | Hershey | |
| 5,891,751 A | 4/1999 | Kurtz et al. | |
| 5,955,771 A | 9/1999 | Kurtz et al. | |
| 5,973,590 A | 10/1999 | Kurtz et al. | |

(Continued)

FOREIGN PATENT DOCUMENTS

| | | |
|---|---|---|
| DE | 10248281 | 4/2004 |
| DE | 2004029084 | 1/2006 |

(Continued)

OTHER PUBLICATIONS

Honeywell, "Pressure Sensors Miniature Signal Conditioned, 40PC Series," 3 pages, prior to May 14, 2008.

(Continued)

*Primary Examiner* — Andre Allen
(74) *Attorney, Agent, or Firm* — Seager Tufte & Wickhem LLC.

(57) ABSTRACT

The present disclosure relates to pressure sensor assemblies and methods. The pressure sensor assembly may include a first substrate, a second substrate and a sense die. The first substrate may be connected to the second substrate, such that an aperture in the first substrate is in fluid communication with an aperture in the second substrate. The second substrate may be connected to the sense die, such that the aperture in the second substrate is in fluid communication with a sense diaphragm on the second substrate. The pressure sensor assembly may include a media path that extends through the aperture in the first substrate, through the aperture in the second substrate, and to the sense die. In some cases, the first substrate, the second substrate and the sense die may be connected in a manner that does not include an adhesive.

13 Claims, 3 Drawing Sheets

(56) References Cited

U.S. PATENT DOCUMENTS

| | | | |
|---|---|---|---|
| 5,999,082 | A | 12/1999 | Kurtz et al. |
| 6,255,728 | B1 | 7/2001 | Nasiri et al. |
| 6,323,550 | B1* | 11/2001 | Martin et al. .................. 257/704 |
| 6,330,829 | B1 | 12/2001 | Kurtz et al. |
| 6,351,996 | B1 | 3/2002 | Nasiri et al. |
| 6,450,039 | B1* | 9/2002 | Masuda .......................... 73/756 |
| 6,467,354 | B1 | 10/2002 | Allen |
| 6,591,686 | B1 | 7/2003 | Kurtz |
| 6,647,794 | B1 | 11/2003 | Nelson et al. |
| 6,868,731 | B1 | 3/2005 | Gatesman |
| 6,931,938 | B2 | 8/2005 | Knirck et al. |
| 6,945,120 | B1 | 9/2005 | Marcus et al. |
| 7,036,384 | B2 | 5/2006 | Tanaka et al. |
| 7,073,375 | B2 | 7/2006 | Parker et al. |
| 7,077,008 | B2 | 7/2006 | Pham et al. |
| 7,168,326 | B2 | 1/2007 | Toyoda et al. |
| 7,194,910 | B2 | 3/2007 | Gatesman |
| 7,331,241 | B1 | 2/2008 | Kurtz et al. |
| 7,436,037 | B2 | 10/2008 | Kurtz et al. |
| 7,603,906 | B2 | 10/2009 | Kroger et al. |
| 7,610,812 | B2 | 11/2009 | Kurtz et al. |
| 7,635,077 | B2 | 12/2009 | Schubert |
| 7,642,115 | B2 | 1/2010 | Eriksen et al. |
| 7,647,835 | B2 | 1/2010 | Speldrich |
| 7,661,318 | B2 | 2/2010 | Brosh et al. |
| 7,677,109 | B2 | 3/2010 | Bentley et al. |
| 7,759,945 | B2 | 7/2010 | Wade |
| 7,802,401 | B2 | 9/2010 | Wild et al. |
| 7,930,944 | B2 | 4/2011 | Machir et al. |
| 7,952,154 | B2 | 5/2011 | Guo et al. |
| 8,013,405 | B2 | 9/2011 | Eriksen et al. |
| 2002/0029639 | A1 | 3/2002 | Wagner et al. |
| 2003/0107096 | A1* | 6/2003 | Kurtz et al. .................. 257/414 |
| 2005/0269678 | A1 | 12/2005 | Martin et al. |
| 2006/0123916 | A1 | 6/2006 | Parker et al. |
| 2007/0271069 | A1 | 11/2007 | Dmytriw et al. |
| 2007/0289380 | A1 | 12/2007 | Lin et al. |
| 2008/0006092 | A1 | 1/2008 | Brida et al. |
| 2008/0222884 | A1 | 9/2008 | Bradley et al. |
| 2010/0122583 | A1 | 5/2010 | Rozgo et al. |
| 2010/0257937 | A1 | 10/2010 | Kurtz |
| 2011/0036176 | A1 | 2/2011 | Bradley et al. |
| 2011/0209553 | A1* | 9/2011 | Crivelli .......................... 73/721 |
| 2012/0266684 | A1* | 10/2012 | Hooper et al. .................. 73/721 |
| 2012/0270354 | A1* | 10/2012 | Hooper et al. .................. 438/51 |

FOREIGN PATENT DOCUMENTS

| | | |
|---|---|---|
| DE | 102004051219 | 5/2006 |
| DE | 102007015476 | 10/2008 |
| EP | 0736757 | 10/1996 |
| EP | 0828147 | 11/1998 |
| EP | 1074827 | 2/2001 |
| EP | 1255099 | 11/2002 |
| EP | 1677090 | 5/2006 |
| EP | 1813300 | 1/2007 |
| EP | 1764598 | 3/2007 |
| EP | 1826543 | 3/2011 |
| GB | 2370968 | 3/2002 |
| JP | 4155233 | 5/1992 |
| JP | 8075581 | 3/1996 |
| JP | 11023397 | 1/1999 |
| JP | 11337431 | 12/1999 |
| JP | 2000046667 | 2/2000 |
| JP | 2000180282 | 6/2000 |
| JP | 2000180283 | 6/2000 |
| JP | 2000352540 | 12/2000 |
| JP | 2001208626 | 8/2001 |
| JP | 2003057138 | 2/2003 |
| WO | 0153789 | 7/2001 |
| WO | 2004001358 | 12/2003 |
| WO | 2007079454 | 7/2007 |

OTHER PUBLICATIONS

Honeywell, "40PC Slides," 2 pages, prior to May 14, 2008.
European Search Report, Application No. 12150214.0-1236.

* cited by examiner

PRESSURE SENSOR

TECHNICAL FIELD

The present disclosure relates generally to sensors, and more particularly, to pressure sensors.

BACKGROUND

Pressure sensors often include a pressure sense element that is configured to detect a pressure of a media to be sensed by converting mechanical stress caused by the incoming pressure of the media into an electrical output signal. Pressure measurements are typically taken in the context of absolute, gauge, or differential (or relative) pressure measurements. An absolute pressure sensor represents a specific type of sensing device, which measures a pressure relative to a vacuum (or near vacuum). A gauge sensor, on the other hand, measures a pressure relative to atmospheric pressure. A differential pressure sensor measures a pressure difference between two inputs. Pressure sensors are used in a wide variety of applications including, for example, commercial, automotive, aerospace, industrial, and medical applications, among other similar and dissimilar industries.

SUMMARY

This disclosure relates generally to sensors, and more particularly, to sensors that are exposed to media during use. Although sensor assemblies are known to exist, there is need for improvement to such sensor assemblies.

Accordingly, in one illustrative embodiment, a pressure sensor assembly may include a first substrate having an aperture, a second substrate having an aperture, and a sense die having a sense diaphragm. The first substrate may be connected to the second substrate, such that the aperture in the first substrate is in fluid communication and/or in registration with the aperture in the second substrate. The second substrate may be connected to the sense die, such that the aperture in the second substrate is in fluid communication and/or in registration with the sense diaphragm of the sense die. The connected pressure sensor assembly may include a media path extending through the aperture in the first substrate, through the aperture in the second substrate, and to and in direct contact with the sense diaphragm of the sense die. Although, the pressure sensor assembly may be made from any suitable material or material combination, the first substrate may include metal, the second substrate may include glass, and the sense die may include silicon.

In some cases, the features of the pressure sensor may be connected in any manner. For example, the first substrate may be joined with the second substrate using a fusing technique to create a hermetic substrate-to-substrate (e.g., metal-to-glass) seal, and the second substrate may be joined with the sense die using an anodic bonding technique or a frit bonding technique to create a substrate-to-sense die (e.g., glass-to-silicon) seal.

In some cases, the pressure sensor assembly may include a port (e.g., a metal port) with an aperture, a printed circuit board, and/or a housing. The port may be connected to the first substrate such that the aperture of the port is in fluid communication and/or in registration with the aperture of the first substrate, where any connection technique may be used to connect the port to the first substrate. For example, the port may be connected to the first substrate through a welding or soldering technique. In some illustrative instances, the printed circuit board of the pressure sensor assembly may be connected to the first substrate, and may be in electrical communication with the sense die. To protect the sense die and printed circuit board, and for other purposes, the housing may be connected to the first substrate, where the housing at least partially encloses the sense die and the printed circuit board. In some cases, the housing may include an external electrical connection that may be electrically linked to the printed circuit board to provide electrical communication from the sense die to a unit or device external to the housing.

The preceding summary is provided to facilitate a general understanding of some of the innovative features of the present disclosure, and is not intended to be a full description. A full appreciation of the disclosure can be gained by taking the entire specification, claims, drawings, and abstract as a whole.

BRIEF DESCRIPTION OF THE DRAWINGS

The accompanying figures, in which like reference numerals refer to identical or functionally-similar elements throughout the separate views, and which are incorporated in and form a part of the specification, further show several illustrative embodiments and, together with the description, serve to explain the several illustrative embodiments, wherein.

Figure 1:
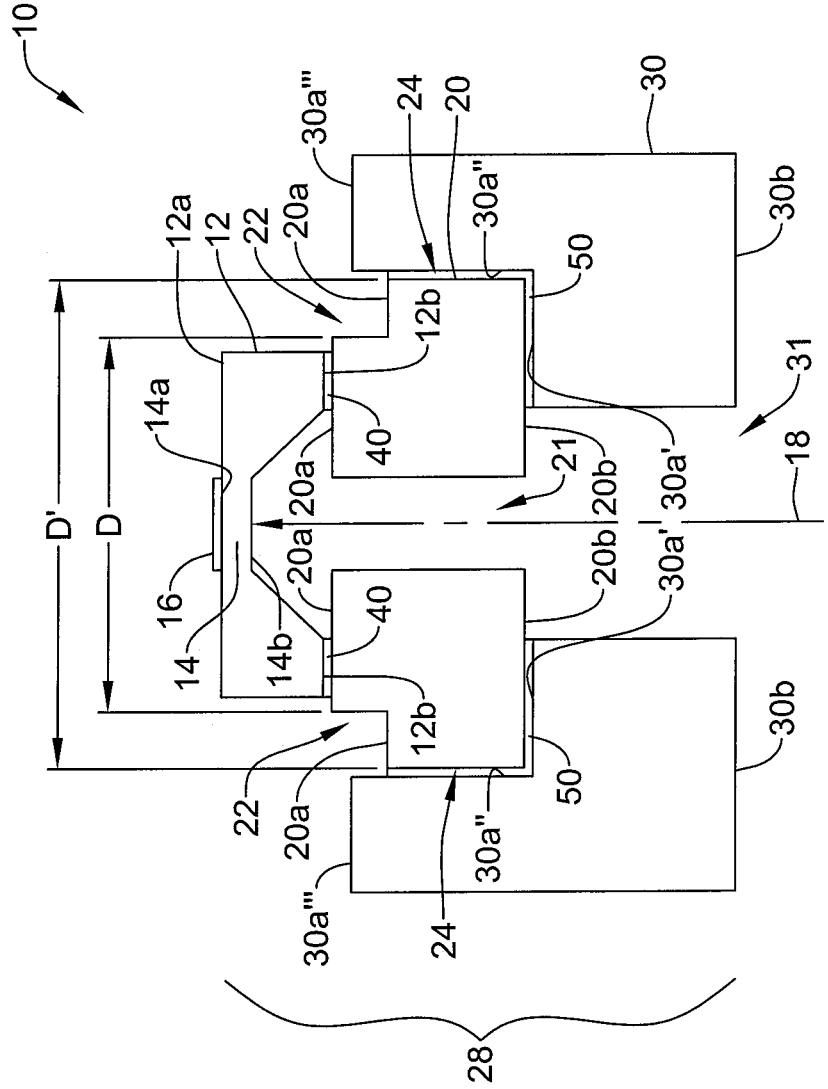
FIG. 1 is a schematic cross-sectional view of an illustrative pressure sensor.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described herein. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings, which are not necessarily to scale, depict illustrative embodiments and are not intended to limit the scope of the disclosure. The illustrative embodiments depicted are intended only as exemplary.

FIG. 1 is a schematic cross-sectional view of an illustrative pressure sensor 10. The pressure sensor 10 may include a sense die 12, a first substrate 30 having an aperture 31, and a second substrate 20 having an aperture 21, where pressure sensor 10 may include a media path 18 extending at least from a second side 30b of first substrate 30 to a second side 12b of sense die 12 and through the apertures 21, 31. As illustrated in FIG. 1, the second side 12b of sense die 12 may be connected to a first side 20a of second substrate 20, and a second side 20b of second substrate 20 may be connected to a first side 30a of first substrate 30. The sense die 12, the second substrate 20 and the first substrate 30 may be connected and/or affixed to one another through one or more various connection techniques including, but not limited to, anodic bonding, frit bonding, fusing, welding, soldering, or any other suitable bonding, connecting or sealing technique, as desired.

The pressure sensor 10 may be any type of pressure sensor. In an illustrative embodiment, pressure sensor 10 may be a pressure sensor such as an absolute pressure sensor, a gauge pressure sensor, or other pressure sensor as desired. Example pressure sensors may include, but are not limited to, those described in U.S. Pat. Nos. 7,503,221; 7,493,822; 7,216,547; 7,082,835; 6,923,069; 6,877,380, and U.S. patent application publications: 2010/0180688; 2010/0064818; 2010/00184324; 2007/0095144; and 2003/0167851, all of which are hereby incorporated by reference.

In some cases, the first substrate 30 may have a first side 30a and a second side 30b with the aperture 31 extending from the first side 30a to the second side 30b. The first substrate 30 may take on any shape and size and may be made of any desirable material, such that its first side 30a is configured to be at least partially affixed to the second substrate 20 and the aperture 31 of the first substrate 30 is configured to be in fluid communication and/or in registration with the aperture 21 of the second substrate 20.

Figure 2:
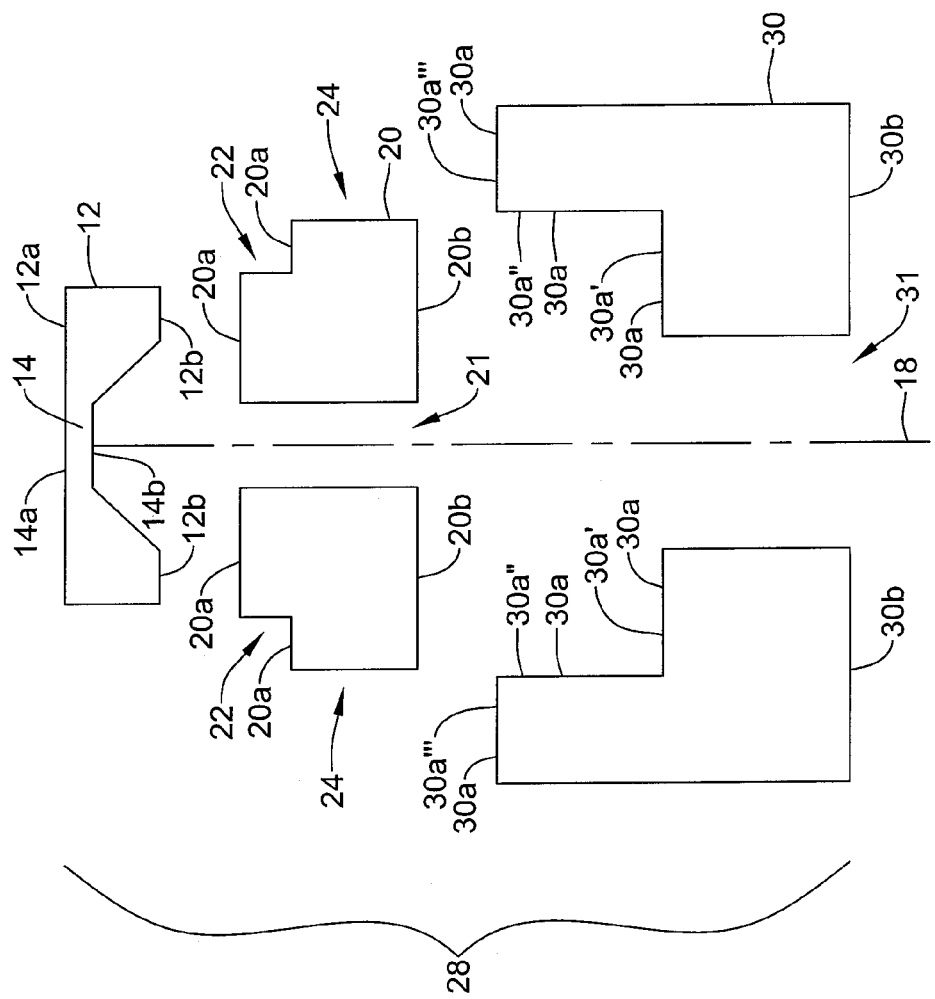
FIG. 2 is a schematic exploded cross-sectional view of the illustrative pressure sensor of FIG. 1.
Figure 3:
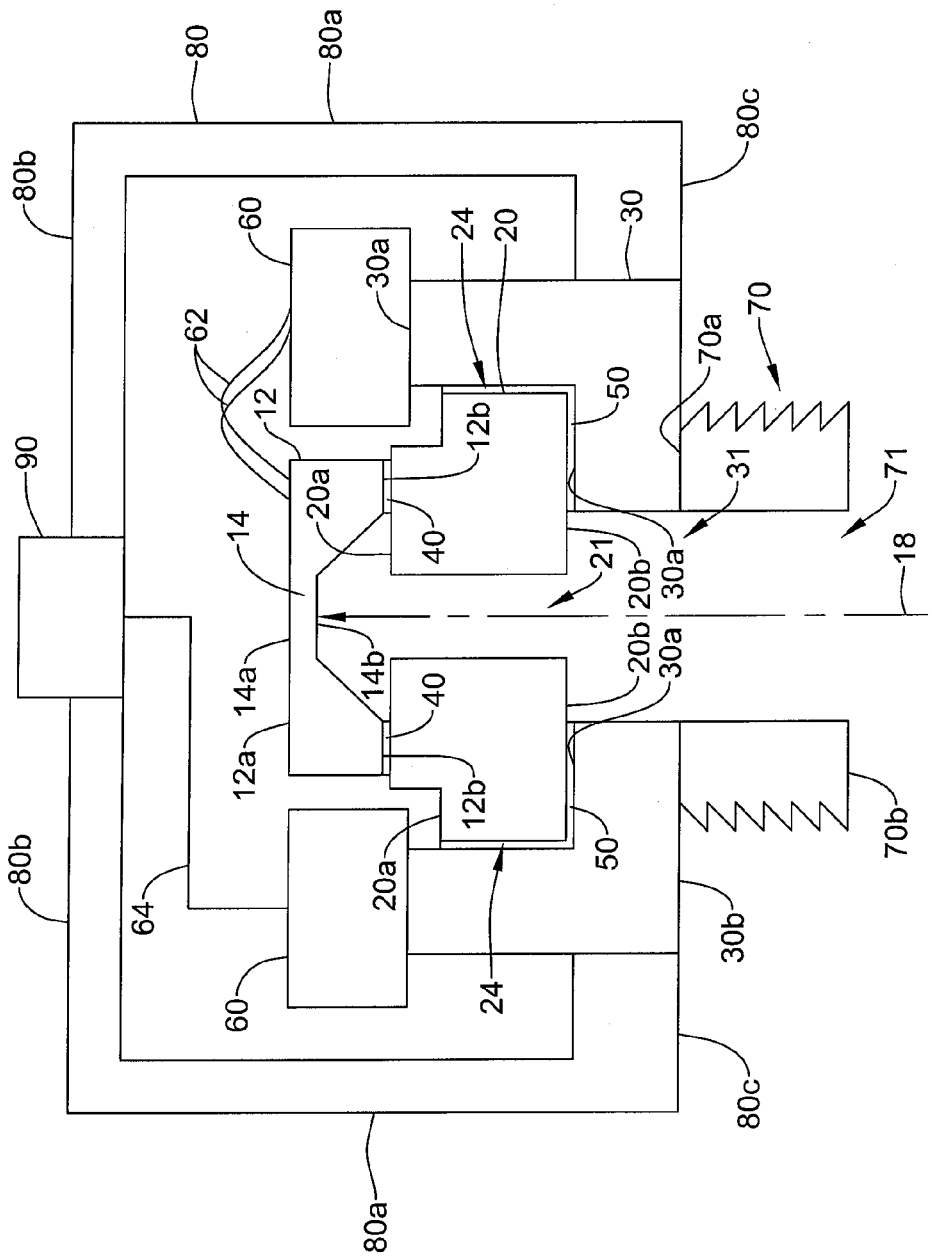
FIG. 3 is a schematic cross-sectional view of an illustrative pressure sensor assembly.

In some instances, the first substrate 30 may be at least partially made from a metal material (e.g., a metal material including aluminum, stainless steel, a nickel-cobalt ferrous alloy such as KOVAR®, any other metal material, and/or any combination of metal materials). In some cases, the first substrate 30 may be entirely made from the metal material, while in other cases, the first substrate 30 may be coated with a metal material. As mentioned, first substrate 30 may take on any shape and size. For example, in some cases, the first side 30a of first substrate 30 may have a bottom surface 30a', a top surface 30a''', and an inner side surface 30a'' extending from the bottom surface 30a' to the top surface 30a''', as shown in FIGS. 1-3. Further, the first substrate 30 may include a fusing surface for connection with the second substrate 20, which in the illustrative embodiment, includes at least a portion of the bottom surface 30a' and/or the inner side surface 30a''.

In some illustrative instances, the first substrate 30 may be layered (e.g., include two or more layers of material), but this is not required. For example, the first substrate 30 may have two or more layers which may be a metal material, where those metal layers may be bonded directly to one another and/or may include one or more intermediate layers that may or may not be of a metal material. Where the first substrate 30 includes two or more metal layers, a first metal layer may be configured to be connected to the second substrate 20 and a second metal layer may be configured to be connected to a metal port 70 or other port or substrate. The first substrate 30 may include two or more layers for any purpose. For example, the first substrate 30 may include two or more layers in applications where a first metal layer may be affixed to the second substrate 20, a second metal layer may be affixed to a metal port 70, and the first and second metal layers may be connected to one another either directly or through one or more intervening layers.

Any intermediate layers of the first substrate 30 may be made of a metal or any other suitable material. Illustratively, any intermediate layer may be made from a material that is capable of being connected or affixed to the metal layers without the use of adhesive (e.g., where a connection is made through a weld or solder connection), as media traveling through aperture 31 may be capable of corroding adhesive materials and may undesirably weaken any seals between layers of the first substrate 30. In addition, any intermediate layer between the two or more metal layers may be made of a material that is capable of being connected to the metal layers of the first substrate 30 in a sealed (e.g., a hermetic sealed) manner. Alternatively, or in addition, the various layers of first substrate 30 (when more than one layer is present) may be coated with a metal coating to facilitate bonding the first substrate 30 to the second substrate 20 and a metal port 70 or the like, and/or to help project the various layers of the first substrate 30 from the media present in aperture 31.

In some cases, the second substrate 20 may have a first side 20a and a second side 20b with the aperture 21 extending from the first side 20a to the second side 20b. The second substrate 20 may take on any shape and size and may be made of any desirable material, such that its first side 20a and second side 20b are configured to be at least partially affixed to the sense die 12 and the first substrate 30, respectively, and the aperture 21 of second substrate 20 may be configured to be in fluid communication and/or in registration with the sense diaphragm 14 of sense die 12 and the aperture 31 of first substrate 30. In one example, the second substrate 20 may be a glass pedestal at least partially made from a glass material (e.g., borosilicate glass, such as PYREX®, BOROFLOAT® 33, HOYA SD-2, and/or other borosilicate glass materials, etc.). In some cases, the glass material(s) of second substrate 20 may have thermal properties that are similar to the thermal properties of a silicon material used for the sense die 12, such that the connection of the sense die 12 with the second substrate 20 creates a platform for the sense die 12 that creates a low stress transmission to the sense diaphragm 14 from thermally generated forces.

In some cases, metal material(s) of the first substrate 30, the glass material(s) of second substrate 20, and the silicon material(s) used for the sense die 12 may all have similar thermal properties, such that the connection of the sense die 12 with the second substrate 20 and the first substrate 30 may create a platform having low stress transmission to the sense diaphragm 14.

In some illustrative instances, the second substrate 20 may be layered (e.g., include two or more layers or sections of material), but this is not required. For example, the second substrate 20 may have two or more layers which may be a glass material, where those glass layers may be bonded directly to one another and/or may include one or more intermediate layers that may or may not be of a glass material. Where the second substrate 20 includes two or more glass layers, a first glass layer may be configured to be connected to the sense die 12 and a second glass layer may be configured to be connected to the first substrate 30, and/or each glass layer may be configured to be connected to both the sense die 12 and the first substrate 30. The second substrate 20 may include two or more layers for any purpose. For example, the second substrate 20 may include two or more layers in applications where a first glass layer may be affixed to the sense die 12, a second glass layer may be affixed to the first substrate 30, and the first and second glass layers may be thereafter connected to one another, where the connections are made in accordance with this disclosure to form a stack 28 comprising the sense die 12, the second substrate 20 (including at least the first and the second glass layers), and the first substrate 30. In some cases where the second substrate 20 includes a first portion 22 having a first diameter D and a second portion 24 having a second diameter D' that nay be greater than diameter D, the first glass layer may comprise the first portion 22 and the second glass layer may comprise the second portion 24.

Any intermediate layer of the second substrate 20 between the two or more glass layers configured to be connected to the sense die 12 and/or the first substrate 30 may be made of glass or any other suitable material. Illustratively, any intermediate layer may be made from a material that is able to be connected or affixed to the glass layers without the use of adhesive, as media traveling through the aperture 21 of second substrate 20 may be capable of corroding adhesives and may undesirably weaken any seals between layers of the second substrate 20. In addition, any intermediate layer between the two or more glass layers may be made of a material that is capable of being connected to the glass layers of the second substrate 20 in a sealed (e.g., a hermetic sealed) manner. Alternatively, or in addition, the various layers of second substrate 20 (when more than one layer is present) may be coated with a glass or other coating to facilitate bonding the second substrate 20 to the first substrate 30 and the sense die 12, and/or to help project the various layers of the second substrate 20 from the media present in aperture 21.

In some instances, the sense die 12 having a first side 12a and a second side 12b may include one or more sense elements, generally shown at 16, and a sense diaphragm 14 (e.g., a pressure sensitive sense diaphragm) having a first side 14a and a second side 14b. The one or more sense elements 16 may be positioned and/or configured to abut and/or be adjacent to the first side 14a of sense diaphragm 14. The second side 14b of sense diaphragm 14 may be configured to receive a pressure from a media traveling along media path 18, where the media path 18 may extend at least from the second side 30b of first substrate 30 to the second side 14b of sense diaphragm 14 so as to apply a pressure to, and in some cases be in direct contact with, the second side 14b of sense diaphragm 14. The pressure sensor 10 may sense the pressure applied to the second side 14b of sense diaphragm 14 through the sense elements 16, facilitating a translation of a mechanical deflection and/or stress of the diaphragm 14 in response to the applied pressure into an electrical signal proportional or otherwise related to the amount of the applied pressure.

Sense die 12 may be made from any suitable material. For example, the sense die 12 may be formed from a silicon material, a material including at least some silicon (e.g., a silicon blend), GaAs, metal, and/or any other material having similar or dissimilar properties. The sense diaphragm 14 maybe formed in sense die 12 by, for example, etching, machining, or any other forming technique configured to form the diaphragm 14 via the second side 12b of sense die 12. In some cases, the sense elements 16 positioned adjacent the first side 14a of sense diaphragm 14 may be piezoresistive elements made from piezoelectric material and/or one or more other materials that may be configured to change or modify its electrical or other properties in response to a mechanical stress or movement.

The layers of pressure sensor 10 may be connected with or without the use of an adhesive. In some cases, as adhesives have been shown to be susceptible to corrosion in pressure sensor applications and as a result cause seals between layers of pressure sensors to weaken, the layers of pressure sensor 10 may be connected without the use of an adhesive.

An illustrative connection between the sense die 12 and the second substrate 20 may include forming a joint through any suitable technique that bonds any portion of the second side 12b of sense die 12 to any portion of the first side 20a of second substrate 20. In one example, the second side 12b of the sense die 12 may be joined to the first side 20a of second substrate 20 through an anodic bonding technique to create a silicon-glass joint 40 forming a seal (e.g., a hermetic seal) around media path 18. An anodic bonding technique may be capable of bonding the sense die 12 to the second substrate 20 without the use of any intermediate or intervening layers. Illustratively, an anodic bonding technique may include abutting at least a portion of the second side 12b of sense die 12 with at least a portion of the first side 20a of second substrate 20 and then applying a voltage across the abutting surfaces at one or more locations designated for forming a joint therebetween. Before, during and/or after applying the voltage across the abutting surfaces, a high temperature (e.g., a temperature in the range of approximately 250-400 degrees Celsius, 200-500 degrees Celsius, 100-450 degrees Celsius, >100 degrees Celsius, or any other suitable range of temperatures) may be applied to one or more of the abutting surfaces (e.g., the first side 20a of the second substrate 20 and the second side 12b of the sense die 12) to facilitate forming a bond between the abutting surfaces of the sense die 12 and the second substrate 20. Such a technique may facilitate the direct bonding of glass molecules of the second substrate 20 with silicon molecules of the sense die 12, without any intervening adhesive layers.

Alternatively, or in addition, in some illustrative instances, the second side 12b of sense die 12 may be joined to the first side 20a of second substrate 20 through a frit bonding technique to create the silicon-glass joint 40 forming a seal (e.g., a hermetic seal) around media path 18. A frit bonding technique may be capable of bonding the sense die 12 to the first substrate without the use of any intervening adhesive layers. Illustratively, a frit bonding technique may include applying a frit paste on one or both of the first side 20a of second substrate 20 and the second side 12b of sense die 12. Then, once the frit paste has been applied, the first side 20a of second substrate 20 and second side 12b of sense die 12 may be placed against one another with the frit paste therebetween, and heat may be applied to one or more of the first side 20a of second substrate 20, the second side 12b of sense die 12, and the frit paste at or near the joining area. Then, the second substrate 20, the sense die 12, and frit paste may be cooled to facilitate solidifying the frit paste and creating the silicon-glass joint 40. Such a technique may facilitate the direct bonding of the glass molecules of the second substrate 20 and the silicon molecules of the sense die 12 with the molecules of the frit paste. Once the sense die 12 and the second substrate 20 have been bonded or joined (e.g., through any suitable technique, as desired), the aperture 21 of second substrate 20 may be in fluid communication and/or in registration with the diaphragm 14 of sense die 12, as seen in FIGS. 1 and 3.

In some cases, a connection between the second substrate 20 and the first substrate 30 may include forming a metal-to-glass joint 50 through any suitable technique (in some cases without an adhesive) that is capable of bonding at least a portion of the second side 20b of second substrate 20 to a portion of the first side 30a of first substrate 30. In one example, the second side 20b of second substrate 20 may be joined to the first side 30a of first substrate 30 through a high temperature joining method, such as a welding or soldering method to form the metal-to-glass joint 50 forming a seal (e.g., a hermetic seal) around media path 18. A high temperature joining method or technique may be capable of bonding the second substrate 20 to the first substrate 30 without the use of any intermediate or intervening layers, such as adhesive layers. Illustratively, a high temperature joining method or technique may include fusing the second substrate 20 to the first substrate 30. This may be accomplished by, for example, heating the second substrate 20 (e.g., a glass substrate) until the second side 20b begins to wet. After the second side 20b of second substrate 20 begins to wet, the first side 30a (e.g., a fusing surface) of first substrate 30 may be applied to the wet portion of the second side 20b of second substrate 20 and then a joining area of the first substrate 30 and the second substrate 20 (e.g., an area where the first substrate 30 and the second substrate 20 are to be joined) may be cooled to allow the glass molecules of the second substrate 20 to fuse to the metal molecules of the first substrate 30. Upon cooling, a hermetically fused metal-to-glass joint 50 may be created. Such a technique may facilitate the direct bonding of glass molecules of the second substrate 20 with metal molecules of the first substrate 30, without any intervening adhesive layers. Once the second substrate 20 and the first substrate 30 have been bonded or joined, the aperture 21 of second substrate 20 may be in fluid communication or registration with the aperture 31 of first substrate 30, as seen in FIGS. 1 and 3.

In some illustrative instances, once the stack 28 including the sense die 12, the second substrate 20, the first substrate 30, and the seals (e.g., hermetic seals) therebetween has been formed, the stack 28 may be connected to a port 70 having a first side 70a and a second side 70b, as shown in FIG. 3. Port 70 may be made of one or more metal materials, or include a portion of metal materials (e.g., metal materials may include aluminum, stainless steel, a nickel-cobalt ferrous alloy such as KOVAR®, any other metal material, and/or any combination of metal materials) such that port 70 may be connected to the stack 28 (e.g., the metal first substrate 30) or a portion of the stack 28 through a welding, soldering, or any other technique configured to create a seal between two metal surfaces, where the seal may be a hermetic seal. In some cases, the stack 28 may be connected to the first side 70a of port 70. Once the stack has been connected with port 70, the media path 18 through pressure sensor 10 may be substantially completely formed so as to extend from the second side 70b of port 70 through the aperture 71 of port 70, through the aperture 31 of first substrate 30, through the aperture 21 of second substrate 20, and to the second side 14b of the sense diaphragm 14 of sense die 12. Although some of the illustrative examples describe port 70 as being attached to a formed stack 28, port 70 may be connected to the first substrate 30 at any time during the assembly of stack 28 (e.g., before or after any assembly of the sense die 12, the second substrate 20, and the first substrate 30). Likewise, the order of bonding the various components of the stack 28 may be changed, as desired.

Once formed, the stack 28 may be able to sense a pressure applied by media traveling through or about media path 18, by utilizing the sense elements 16 on the first side 14a of sense diaphragm 14. The sense elements 16 may translate a mechanical stress and/or deflection of the sense diaphragm 14, caused by pressure on the second side 14b of sense diaphragm 14 deflecting the diaphragm 14, into electrical signals proportional or otherwise related to the pressure on, at, or applied to the second side 14b of sense diaphragm 14. In some cases, the produced electrical signal may be transferred from the stack 28, through one or more wire bonds or other electrical connection between sense die 12 and a board 60. In some cases, the board 60 may be secured relative to at least the first substrate 30 (e.g., the board 60 may be secured on and/or relative to the top surface 30a''' of the first side 30a of first substrate 30) of stack 28. The wire bonds may pair the electrical signals from the stack 28 with processing signals for compensation. The board 60 may be or may include a printed circuit board ("PCB"), a processor, a ceramic substrate and/or any other components configured to facilitate and/or receive an electrical signal from the sense die 12 and/or compensate the signal as desired. The wire bonding process may include attaching a first end of one or more wire bonds 62 to one or more wire bond pads and/or traces on the sense die 12, and a second end of one or more wire bonds 62 to one or more bond pads and/or traces on the board 60.

After or, in some cases, before making a connection between the sense die 12 and the board 60, a housing 80 may be placed at least partially around the stack 28. As shown in FIG. 3, the housing 80 may include a side wall 80a (e.g., a single side wall if housing 80 is circular and multiple side walls if housing 80 takes on shapes with one or more side edge (e.g., a rectangle, a triangle, etc.)), a top wall 80b (e.g., there may be one or more top walls 80b depending on the shape of the housing 80), and a bottom wall 80c (e.g., there may be one or more bottom walls 80c depending on the shape of the housing 80).

The housing 80 may connect to stack 28 at any location on stack 28, where the connection is configured to isolate and/or enclose the sense diaphragm 14 and one or more seals between the sense die 12, the second substrate 20 and the first substrate 30. For example, the housing 80 may connect to a side of the first substrate 30 between the first side 30a and the second side 30b, as shown in FIG. 3. Alternatively, or in addition, the housing 80 may be attached to port 70, the second substrate 20, the board 60, other portion(s) of the stack 28, and/or any other feature of pressure sensor assembly 10, as desired.

In some cases, the housing 80 may include an external electrical connection 90 extending from a top side 80b or other side 80a, 80c of housing 80, as desired, to provide electrical communication between the sense die 12, the board 60 and/or external electronics. The external electrical connection 90 may be connected to the board 60 through one or more electrical connection links or lines 64. The one or more electrical connection lines 64 may be wireless and/or wired connection lines configured to connect the external electrical connection 90 with the board 60 and/or the sense die 12 to provide electrical contact with the outside world. The external electrical connection 90 may be a plug having prongs, a via filled with electrically conductive material, and/or any other electrical connection configured to provide electrical communication from external the housing 80 to internal the housing.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A sensor assembly, comprising:
   a metal substrate having a first side and a second side, with an aperture extending between the first side and the second side;
   a glass substrate having a first side and a second side, with an aperture extending between the first side and the second side;
   the first side of the metal substrate is fused to the second side of the glass substrate along a fusing surface to form a hermetic glass-to-metal seal, with the aperture in the glass substrate in fluid communication with the aperture in the metal substrate;
   a sense die having a first side and a second side, the sense die defining a pressure sensitive diaphragm that has one or more sense elements mounted adjacent to the first side of the sense die; and
   the second side of the sense die is bonded to the first side of the glass substrate with one of an anodic bond and a frit bond, with the aperture in the glass substrate in fluid communication with the diaphragm of the sense die.

2. The sensor assembly of claim 1, wherein:
   the first side of the metal substrate has a bottom surface, a top surface, and an inner side surface extending from the bottom surface to the top surface, where the fusing surface includes at least a portion of the bottom surface and at least a portion of the inner side surface of the metal substrate.

3. The sensor assembly of claim 2, further comprising:
a printed circuit board secured relative to the metal substrate; and
wherein one or more bond pads on the sense die are connected to one or more bond pads on the printed circuit board.

4. The sensor assembly of claim 1, wherein the metal substrate is at least partially formed of a nickel-cobalt ferrous alloy.

5. The sensor assembly of claim 1, wherein the hermetic glass-to-metal seal is formed by heating the glass substrate until the glass substrate wets, and is then fused to the metal substrate upon cooling.

6. The sensor assembly of claim 1, further comprising:
a metal port bonded to the second side of the metal substrate, wherein a media path extends through the metal port, through the aperture in the metal substrate, through the aperture in the glass substrate, and to the pressure sensitive diaphragm of the sense die.

7. The sensor assembly of claim 6, wherein the metal port is bonded to the second side of the metal substrate via a weld connection.

8. The sensor assembly of claim 6, wherein the metal port is bonded to the second side of the metal substrate via a solder connection.

9. A sensor apparatus, comprising:
a first substrate having a first side and a second side, with an aperture extending between the first side and the second side;
a second substrate having a first side and a second side, with an aperture extending between the first side and the second side;
a hermetic substrate-to-substrate fusion seal between the first side of the first substrate and the second side of the second substrate along a fusing surface, with the aperture in the second substrate in registration with the aperture in the first substrate;
a sense die having a first side and a second side, the sense die having one or more sense elements; and
the second side of the sense die is joined to the first side of the second substrate, with the aperture in the second substrate in fluid communication with the sense die; and
wherein a media path extends through the aperture in the first substrate, through the aperture in the second substrate and in direct contact with the sense die.

10. The sensor apparatus of claim 9, wherein the second side of the sense die is joined to the first side of the second substrate via a frit bond.

11. The sensor apparatus of claim 9, wherein the second side of the sense die is joined to the first side of the second substrate via an anodic bond.

12. The sensor apparatus of claim 9, wherein:
the first substrate includes metal;
the second substrate includes glass; and
the sense die includes silicon.

13. The sensor apparatus of claim 12, wherein thermal properties of the first substrate, the second substrate, and the sense die result in low stress transmission of thermally generated external forces to the sense die.

* * * * *